US007888169B2

(12) United States Patent
Mohapatra et al.

(10) Patent No.: US 7,888,169 B2
(45) Date of Patent: Feb. 15, 2011

(54) ORGANIC SEMICONDUCTOR DEVICE AND METHOD OF MANUFACTURING THE SAME

(75) Inventors: Siddharth Mohapatra, Federal Way, WA (US); Robert P. Wenz, Austin, TX (US)

(73) Assignee: Organicid, Inc., Colorado Springs, CO (US)

( * ) Notice: Subject to any disclaimer, the term of this patent is extended or adjusted under 35 U.S.C. 154(b) by 240 days.

(21) Appl. No.: 11/964,577

(22) Filed: Dec. 26, 2007

(65) Prior Publication Data

US 2009/0239333 A1 Sep. 24, 2009

(51) Int. Cl.
*H01L 51/40* (2006.01)
*H01L 21/00* (2006.01)
*H01L 21/84* (2006.01)

(52) U.S. Cl. .............. 438/99; 438/149; 257/E51.005; 257/E51.006; 257/E51.027; 257/E51.029; 257/E29.117; 257/E29.137; 250/492.1; 250/492.2

(58) Field of Classification Search .............. 438/99, 438/149; 257/E51.027, E51.029, E29.117, 257/E29.137, E51.005–E51.006; 250/492.1–492.2
See application file for complete search history.

(56) References Cited

U.S. PATENT DOCUMENTS

| | | | |
|---|---|---|---|
| 5,130,274 A | | 7/1992 | Harper et al. |
| 5,565,379 A * | | 10/1996 | Baba .......................... 438/614 |
| 6,091,152 A | | 7/2000 | Iwata |
| 6,485,884 B2 | | 11/2002 | Wolk et al. |
| 6,635,566 B1 | | 10/2003 | Blosse et al. |
| 6,723,631 B2 | | 4/2004 | Noguchi et al. |
| 6,821,553 B2 * | | 11/2004 | Miyashita et al. ............. 427/66 |
| 7,250,365 B2 | | 7/2007 | Arai et al. |
| 7,262,384 B2 | | 8/2007 | Jackson |
| 2004/0033641 A1 | | 2/2004 | Yang et al. |
| 2004/0110321 A1 * | | 6/2004 | Oda et al. .................... 438/118 |
| 2005/0026344 A1 * | | 2/2005 | Weng et al. .................. 438/197 |
| 2005/0205202 A1 | | 9/2005 | Chaoui et al. |
| 2005/0269407 A1 | | 12/2005 | Harmon |
| 2006/0094178 A1 | | 5/2006 | Lin |
| 2006/0216193 A1 | | 9/2006 | Johnson et al. |
| 2007/0018832 A1 | | 1/2007 | Beigel et al. |
| 2007/0020798 A1 | | 1/2007 | Wu |
| 2007/0040165 A1 * | | 2/2007 | Dimmler et al. ............... 257/40 |
| 2007/0194302 A1 * | | 8/2007 | Inoue et al. .................... 257/40 |
| 2007/0252229 A1 * | | 11/2007 | Fujimori et al. ............. 257/489 |

(Continued)

OTHER PUBLICATIONS

Ko et al.—Air stable high resolution organic transistors by selective laser sintering of ink-jet printed metal nanoparticles, Applied Physics Letters, vol. 90, pp. 141103-1-141103-3, Apr. 2007.*

(Continued)

*Primary Examiner*—Zandra Smith
*Assistant Examiner*—Jeremy J Joy

(57) ABSTRACT

A low-cost and efficient process producing improved organic electronic devices such as transistors that may be used in a variety of applications is described. The applications may include radio frequency identification (RFID) devices, displays and the like. In one embodiment, the improved process is implemented by flash annealing a substrate with an energy having wavelengths ranging from about 250 nm to about 1100 nm or higher. In this flash annealing process energy having wavelengths from about 250 nm to about 350 nm or higher is substantially prevented from irradiating the substrate.

8 Claims, 4 Drawing Sheets

U.S. PATENT DOCUMENTS

| | | | |
|---|---|---|---|
| 2008/0020304 A1* | 1/2008 | Schroder et al. | 430/39 |
| 2008/0169464 A1* | 7/2008 | Gong et al. | 257/40 |
| 2008/0197343 A1* | 8/2008 | Blache et al. | 257/40 |
| 2008/0311698 A1* | 12/2008 | Mohapatra et al. | 438/99 |
| 2009/0166612 A1* | 7/2009 | Cain et al. | 257/40 |
| 2010/0244015 A1* | 9/2010 | Honda et al. | 257/40 |

OTHER PUBLICATIONS

Foggiato et al.—Millisecond flash annealing: Applications for USJ formation and optimization of device electrical characteristics, Materials Science and Engineering B, vol. 124-125, pp. 219-222, Dec. 5, 2005.*

Zhang, Quitao, Li, Sha, Investigation of the potential of organic circuit for RFID tags, University of California Berkeley, No Date, pp. 3.

Advanced Curing for Printed Electronics, NovaCentrix, No Date, pp. 4.

Photonic Curing System for Printed Electronics, NovaCentrix, No Dtae, pp. 6.

Ko Seung et al., "Air stable high resolution organic transistors by selective laser sintering of ink-jet printed metal nanoparticles" Applied Physics Letters, AIP, Maerican Institute of Physics, Melville, NY, vol. 90, No. 14, Apr. 3, 2007, pp. 141103-1-1411-3-3, XP012093905, ISSN: 0003-6951, pp. 141103-2; figure 1.

Foggiato, J. et al.: "Millisecond flash annealing: Applications for USJ formation and optimization of devise electrical characteristics", Materials Science and Engineering B, Elsevier Sequoia, Lausanne, CH, vol. 124-125, Dec. 5, 2005, pp. 219-222, XP025304817, ISSN: 0921-5107, p. 219, abstract.

Ping, Liu, et al.: "Enabling Gate Dielectric Design for All Solution-Processed, High-Performance, Flexible Organic thin-Film Transistors" Journal of the American Chemical Society, vol. 128, No. 14, Mar. 10, 2006, pp. 4554-4555, XP007907662, ISSN: 0002-7863, p. 4554; figure 1.

Yiliang, Wu, et al.: "Organic Thin-Film Transistors with Contacts Printed From Metal Nanoparticles" Materials Research Society Symposium Proceedings, Materials Research Society, Pittsburg, PA, vol. 871E, 1 Jan. 2005, XP007907659, ISN: 0272-9172, p. 12.3.2-p. 12.3.4, abstract.

Notice of Allowance mailed Nov. 15, 2010 from U.S. Appl. No. 11/764,362, filing date Jun. 18, 2007.

* cited by examiner

ORGANIC SEMICONDUCTOR DEVICE AND METHOD OF MANUFACTURING THE SAME

CROSS-REFERENCE TO RELATED CASE

The present invention is related to the subject matter disclosed in co-pending patent application Ser. No. 11/764,326, entitled "FABRICATION OF SELF-ALIGNED VIA HOLES IN POLYMER THIN FILMS", filed Jun. 18, 2007, the disclosure of which is herein specifically incorporated by this reference.

BACKGROUND OF THE INVENTION

1. Field of the Invention

The invention relates to organic devices and more particularly to a method for improving the performance of organic devices. The invention is directed towards fabricating organic devices, such as transistors that may be used in a variety of applications.

2. Discussion of the Related Art

Recently there has been a wide interest in the manufacture of organic transistors which may be used in a variety of different applications including displays, electronic barcodes, sensors, radio frequency identification (RFID) devices and the like. Low cost manufacturing processes that provide greater physical flexibility, printability and ease of design modification are the driving forces for these applications.

A printed top gate, bottom gate, top source/drain contact, bottom source/drain contact and staggered transistors are currently being used. However, there is a problem with current manufacturing techniques; they are inefficient as they require a number of process steps. In addition, they potentially damage the organic semiconductor material and/or dielectric material when process steps are reduced, thereby providing low on and high off channel currents leading to linear and/or saturation mobilities.

There is currently a need to provide low cost manufacturing processes that improve overall device performance.

SUMMARY OF THE INVENTION

Accordingly, the invention is directed to a method of making an organic semiconductor device that substantially obviates one or more of the problems due to limitations and disadvantages of the related art.

An advantage of the invention is to provide a low cost and efficient manufacturing method that reduces processing steps.

Another advantage of the invention is that it offers greater physical flexibility, printability and ease of design modification.

Yet another advantage of the invention is to provide higher on and lower off channel currents that translate into improved linear mobility and/or saturation mobility.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention as embodied and broadly described, the invention is directed towards a method of flash annealing to cure nanoparticle ink including flash annealing the nanoparticle ink with an energy having wavelengths ranging from about 250 nm to about 1100 nm or higher. Substantially preventing the energy having wavelengths from about 250 nm to about 350 nm or higher from irradiating the nanoparticle ink.

In another aspect of the invention, the invention is directed towards a method of manufacturing an organic transistor includes providing a substrate and forming a gate electrode on the substrate. Selectively forming nanoparticle ink on the gate electrode to form posts and selectively forming a dielectric material on the substrate. Flash annealing the nanoparticle ink with an energy having wavelengths ranging from about 250 nm to about 1100 nm or higher, wherein the flash annealing comprises preventing energy having wavelengths from about 250 nm to about 350 nm or higher from irradiating the nanoparticle ink. The flash annealing process cures the nanoparticle ink and simultaneously forms vias in the dielectric layer. A gate electrode is formed to be in electrical communication with the posts. An organic semiconductor layer is then formed on the substrate.

In yet another aspect of the invention, the invention is directed towards a method of a method of manufacturing a semiconductor device including providing a substrate and forming a source/drain region on the substrate. An organic semiconductor material is then printed on the substrate and annealed. Nanoparticle ink is then selectively formed on the source/drain regions. A dielectric layer is selected formed on the substrate and nanoparticle ink and annealed. Flash annealing the nanoparticle ink is used to cure the nanoparticle ink and simultaneously form vias with an energy having wavelengths ranging from about 250 nm to about 1100 nm or higher. In the flash annealing process energy having wavelengths from about 250 nm to about 350 nm or higher are substantially prevented from irradiating at least the nanoparticle ink.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 1A-1G illustrate sequential process steps for forming an organic top gate transistor according to an embodiment of the invention wherein:

FIG. 1A illustrates a cross-sectional view of a process step wherein the substrate is provided;

FIG. 1B illustrates a cross-sectional view of a process step wherein conductive source/drain regions are formed on the substrate;

FIG. 1C illustrates a cross-sectional view wherein an organic semiconductor material is formed on the substrate;

FIG. 1D illustrates a cross-sectional view wherein posts are formed on the substrate;

FIG. 1E illustrates a cross-sectional view wherein a dielectric material is formed on the substrate;

FIG. 1F illustrates a cross-sectional view wherein the substrate is exposed to a flash annealing process;

FIG. 1G illustrates a cross-sectional view wherein a gate material is formed on the substrate;

FIGS. 2A-2G illustrate sequential process steps for forming an organic bottom gate transistor according to another embodiment of the invention wherein:

FIG. 2A illustrates a cross-sectional view of a process step wherein a substrate is provided;

FIG. 2B illustrates a cross-sectional view wherein a gate material is formed on the substrate;

FIG. 2C illustrates a cross-sectional view of a process step wherein posts are formed on the substrate;

FIG. 2D illustrates a cross-sectional view wherein a dielectric material is formed on the substrate;

FIG. 2E illustrates a cross-sectional view wherein the substrate is exposed to a flash annealing process;

FIG. 2F illustrates a cross-sectional view wherein source/drain regions are formed on the substrate; and FIG. 2G illustrates a cross-sectional view wherein an organic semiconductive material is formed on the substrate.

DETAILED DESCRIPTION OF THE ILLUSTRATED EMBODIMENTS

Figure 1A:
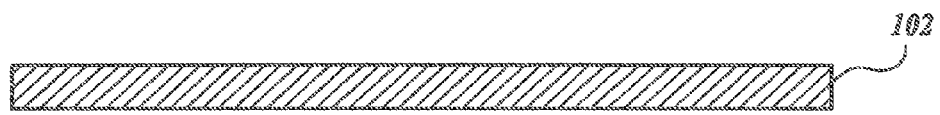

The invention relates to organic devices and more particularly to a method for improving the performance of organic devices. The invention is directed towards fabricating organic devices, such as transistors that may be used in a variety of applications. The variety of applications may include displays organic radio frequency identification (RFID) devices, among others. The organic radio frequency identification (RFID) devices may also be referred to as an ID tag, IC tag, an RF tag, a wireless tag, a wireless chip and the like. This invention is further directed towards the manufacture of low-cost devices with an efficient process.

More specifically, the invention is directed towards forming an organic semiconductor device having improved performance and methods of manufacturing the same.

In one embodiment, the invention is directed towards a method of flash annealing process to cure nanoparticle ink. The flash annealing process includes flash annealing a nanoparticle ink with an energy having wavelengths ranging from about 250 nm to about 1100 nm or higher. In addition, the flash annealing process includes substantially preventing energy having wavelengths from about 250 nm to about 350 nm from irradiating the nanoparticle ink.

It has been discovered that the flash annealing typically produces a spectrum of energy having wavelengths typically ranging from about 250 nm to about 1100 nm or higher. It has further been discovered that energy having wavelengths from about 250 to about 350 nm damages the semiconductor device. For example, energy having these wavelengths damages the organic semiconductor material and/or dielectric material. The damage is very problematic as it adversely affects the overall performance of the device. More specifically, the linear and saturation mobilities of the device are adversely affected as discussed in detail herein.

It has been discovered by substantially preventing energy having wavelengths from about 250 nm to about 350 nm or higher from irradiating the nanoparticle ink during the curing process and/or via hole formation process the overall performance of the organic semiconductor device is improved.

Preventing energy having wavelengths from about 250 nm to about 350 nm or higher from irradiating the substrate during the processing steps may be accomplished by a number of techniques. For example, the flashing anneal apparatus may be configured to not produce energy in these wavelengths. In addition, at least one filter or multiple filters may be utilized in the process to substantially prevent energy having wavelengths from about 250 nm to about 350 nm or higher from irradiating the substrate. Of course, other techniques and combinations of techniques may also be utilized.

Any filter or filters that can substantially prevent energy having wavelengths ranging from about 250 nm to about 350 nm or higher can be utilized with the flash annealing apparatus in the flash annealing process. In one embodiment, at least one filter including common soda lime glass was utilized with a flash annealing apparatus, such as a PCS™ 1100 Photonic Curing System™ by NovaCentrix irradiating with energy having wavelengths ranging from about 250 nm to about 1100 nm. A filter was placed between the sample and the flash annealing apparatus to substantially prevent energy having wavelengths from about 250 nm to about 350 nm from irradiating the substrate during the processing steps. Some experimental results are shown in Tables 1 and 2 below. Of course other filters achieving the same filtration of wavelengths may also be utilized. Alternatively, a flash annealing apparatus can be employed that does not emit energy having wavelengths ranging from about 250 nm to about 350 nm without the use of a filter.

In another embodiment, an organic semiconductor device is manufactured. The organic semiconductor device includes an organic transistor. The organic transistor includes a substrate with a source/drain region formed on the substrate. An organic semiconductor material is formed on the substrate, and nanoparticle ink is selectively printed on the source/drain regions. A dielectric layer is formed on the substrate. Flash annealing the nanoparticle ink to cure the nanoparticle ink and simultaneously form vias with an energy having wavelengths ranging from about 250 nm to about 1100 nm or higher is used. A conductive layer is formed into a gate electrode to electrically couple the source/drain regions.

The substrate may be any flexible or rigid substrate as known in the art. For example, the substrate may be an electrically insulating substrate such as a plastic substrate, paper substrate, and other insulating materials. The flexible substrate may include materials as known in the art. For example, the flexible substrates may include polyethylene terephthalate (PET) material, polyethylene napthalate (PEN) material, Kapton material, mylar material, combinations of the same and the like. The rigid substrate may include materials such as silicon, sapphire or other insulating substrate. Preferably, the substrate includes PET material.

The source/drain regions may be a conductive source/drain region. The conductive source/drain regions may be formed from any material that conducts electricity as known in the art. For example, the conductive source/drain regions may include materials such as metals, conductive polymers, nanoparticle ink, combinations of the same and/or other materials as known in the art. For example, the conductive polymers and co-polymers may include a poly(3,4-ethylenedioxythiophene) (PEDOT) polymer, polystyrenesulfonate (PSS) polymer, poly(3,4-ethylenedioxythiophene) polystyrenesulfonate (PSS) co-polymer (PEDOT:PSS), and combinations of the same.

The conductive source/drain region may be formed with sublimation and evaporation of solid source techniques, deposition via liquid techniques and other formation techniques as known in the art. For example, the formation techniques may include physical vapor deposition (PVD), chemical vapor deposition (CVD), plasma enhanced chemical vapor deposition (PECVD), electron beam deposition (E-beam), sputtering and the like. In a preferred embodiment of the invention, electron beam deposition is utilized to deposit the metal to a thickness ranging from about 150 nm to about 30 nm or less. Preferably, gold is deposited to a thickness of about 30 nm or less.

An organic semiconductor material is formed as an active region of the organic semiconductor device. The organic semiconductor includes any material capable of exhibiting semiconducting properties. For example, the organic semiconductive material includes organic polymers. The organic polymers give the device, e.g., a transistor, advantageous properties like flexibility and low processing temperature. The low processing temperatures permit the use of versatile substrates as discussed herein.

Most organic semiconductor materials are soluble in solvents, such as poly-3-hexylthiophene (P3HT) in chloroform and others as known in the art. Accordingly, inexpensive fabrication printing methods, e.g., inkjet printing and others, may be used for forming the organic semiconductor materials. Moreover, the printing formation method is a selective formation method, e.g., a maskless process, thereby reducing the processing costs dramatically.

Other polymers or co-polymers may be used in the organic semiconductor material, such as ones known in the art. For example, the polymers may include derivates, conjugated polymers and small molecules, such as p-type small molecules and n-type small molecules. For example, some p-type small molecules may include pentacene, thiophene, e.g., sexithiophene, quaterthiophene, among others. Some n-type small molecules may include N,N'-bis(n-octyl)-dicyanoperylene-3,4:9,10-bis(dicarboximide) (PDI8CN2), N,N-dioctyl-3,4,9,10-perylenetetracarboxylic diamide (PTCDI-C8), among others. In a preferred embodiment, derivates of polythiophene can be used.

Typically, annealing of the organic semiconductor material is conducted following the formation of the organic semiconductor material. The annealing may be conducted by heating the organic semiconductor to a predetermined temperature for a predetermined time. The heating is performed with a heating apparatus as known in the art. For example, the heating apparatus may be a hot plate, halogen lamp or the like.

In an aspect of the invention, when forming an organic transistor the annealing may be conducted at a temperature ranging from about 50° C. to about 300° C. or higher, and more preferably to a temperature ranging from about 90° C. to about 150° C., and even more preferably to a temperature of about 140° C.

The annealing may be conducted at any of the foregoing temperatures for time ranging from about 1 minute to about 3 hours, preferably for a time ranging from about 3 to about 20 minutes, and more preferably for a time of about 5 minutes. Cooling may be conducted as known in the art. Preferably, the semiconductor is cooled to a temperature of about 90° C. via ambient temperature or a controlled unit.

Conductive posts are formed to be electrically coupled to the conductive source/drain regions. These conductive posts are formed using any conductive material as known in the art. The posts may be formed with techniques as known in the art. For example, the conductive posts may be formed with techniques described in the U.S. patent Ser. No. 11/764,326, which is hereby incorporated by reference. Preferably, the conductive posts are selectively formed, e.g., printed via nanoparticle material. The nanoparticle material may be a metal or alloy material. In one aspect of the invention, when forming transistors the posts are formed to a thickness ranging from about 1 nm to about 10 µm or greater. Preferably, Ag nanoparticle posts are formed to a thickness in the range from 0.1 to 1 µm. More preferably, the Ag nanoparticle posts are formed to a thickness of about 0.5 µm.

A dielectric material is formed to cover the substrate with techniques known in the art. For example, the dielectric material is formed as described in U.S. patent Ser. No. 11/764,326, which is hereby incorporated by reference. The dielectric material may be made from cross-linked and non-cross-linked hydrophobic polymers, such as polyvinylphenol polymer. Preferably, a long chain hydrophobic polymer is used. The thickness of the dielectric is adjusted to achieve the desired insulating characteristics of the device. In one aspect of the invention when forming transistors the thickness may range from about 50 nm to about 10 µm, and more preferably range from about 100 nm to about 500 nm, and most preferably range from about 250 nm to about 350 nm. After formation the dielectric material may be annealed in the range from about 50° C. to about 200° C., and preferably in the range from about 75° C. to about 125° C., and more preferably at about 100° C.

A flash anneal process is performed to form cure the nanoparticle ink and simultaneously form a via through the dielectric layer as taught in U.S. patent Ser. No. 11/764,326, which is hereby incorporated by reference. This simultaneous via formation reduces the number of process steps and thereby reduces the overall cost of devices produced with this process step. The flash anneal apparatus produces energy which causes the dielectric material over the conductive posts to be removed, e.g., forming a via exposing at least a portion of the conductive posts. The flash anneal process is also used for curing the nanoparticle ink. It is not required that the flash anneal be utilized for forming a via, that is, the dielectric layer may be patterned with conventional processing techniques. In addition, the nanoparticle ink of the conductive post material may also be annealed with other techniques as taught in U.S. patent Ser. No. 11/764,326.

As discussed herein, it has been discovered that conventional flash anneal apparatus produce a spectrum of energy having wavelengths ranging from about 250 nm to about 1100 nm that damage the organic semiconductor material and/or the dielectric material during a curing and/or via forming step. The damage to the organic semiconductor is very problematic as it adversely affects the overall performance of the device. More specifically, the linear and saturation motilities of the device are adversely affected as discussed in detail below. It has been discovered that by substantially preventing energy having wavelengths from about 250 nm to about 350 nm or higher from irradiating the substrate during processing the overall performance of the organic semiconductor device can be dramatically improved.

In one aspect of the invention, a filter may be used to substantially prevent energy having wavelengths ranging from about 250 nm to about 350 nm from irradiating the substrate during the flash annealing process. Alternatively, a flash annealing apparatus can be employed that does not emit energy having wavelengths ranging from about 250 nm to about 350 nm with or without a filter. In addition, a flash annealing apparatus may need not be used to form the vias and/or cure the nanoparticle ink, that is, conventional techniques as known in the art may be utilized.

More specifically, at least one common soda-lime glass filter may be inserted between the test chip and the flash annealing apparatus, such as a PCS™ 1100 Photonic Curing System™ by NovaCentrix flash annealing apparatus. This filter substantially prevented energy having wavelengths ranging from about 250 nm to about 350 nm from irradiating the substrate during the curing process step. Experimental results are shown in Table 1 below.

The conductor layer is formed and patterned on the substrate, thereby forming a gate electrode electrically coupled to the source/drain regions. In this embodiment, the gate electrode is formed from gold or silver with evaporated deposition techniques and etched to the desired shape with conventional photolithography. However, the conductor layer may include any conductive material such as metal, alloy, conductive polymer, combinations of the same and the like as known in the art.

The conductor layer may be formed by techniques as known in the art such as depositing a solution, or depositing ink in a pattern with technologies including gravure, inkjet, flexography, silk screening and the like. Of course, the conductor layer can be formed with photolithography and deposition techniques such as physical vapor deposition (PVD), chemical vapor deposition (CVD), plasma enhanced chemical vapor deposition (PECVD), Electron beam deposition (E-beam), sputtering and the like.

Reference will now be made in detail to embodiments of the invention, examples of which are illustrated in the accompanying drawings.

FIGS. 1A-1G illustrate sequential process steps for forming a top gate organic transistor according to an embodiment of invention. FIG. 1A illustrates a cross-sectional view of a process step wherein the substrate is provided.

Figure 1B:
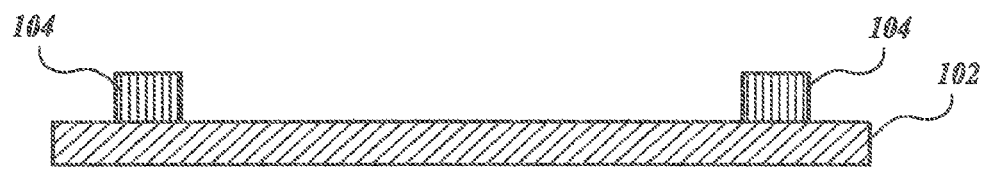
Figure 1C:
Figure 1D:
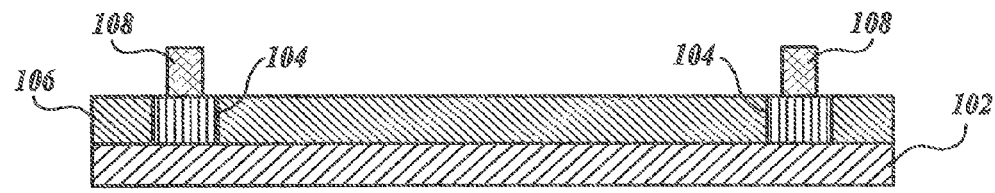
Figure 1E:
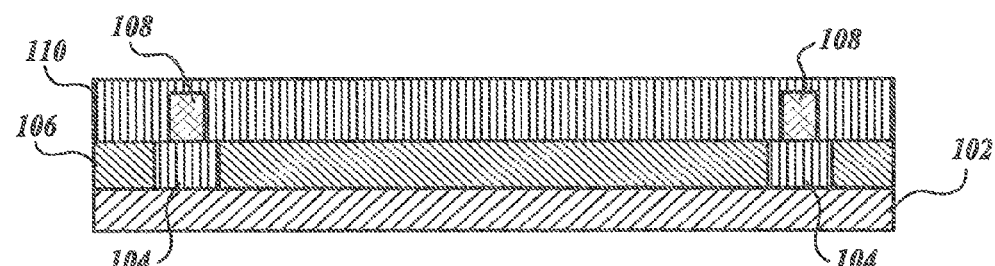

Referring now to FIGS. 1A-C, a method of forming an organic semiconductor transistor includes providing a plastic substrate 102 and forming conductive source/drain regions 104. The conductive source/drain regions 104 are formed from Au with photolithography and deposition techniques described herein. An organic semiconductor layer 106 is formed on the substrate 102. In this embodiment, the organic semiconductor layer 106 is a polymer, e.g., a polythiophene derivative and selectively formed, e.g., printed using an inkjet printer. The semiconductor layer is annealed with a heating apparatus.

Conductive posts 108 are formed on the source/drain 104. The conductive posts 108 are printed using nanoparticle conductive ink. This printing permits selective formation of the conductive posts 108. That is, the conductive posts 108 are selectively formed on the source/drain regions 104. In this embodiment, the Ag nanoparticle ink was used to form the conductive posts 108 as taught in U.S. patent Ser. No. 11/764,326, which is hereby incorporated by reference.

A dielectric layer 110 is formed over the substrate, thereby covering the conductive posts 108. It is noted, that the dielectric layer 110 may be formed to a height lower than the conductive posts 108. In this embodiment, the dielectric layer 110 is a long chain hydrophobic polymer and is printed onto the substrate. The dielectric layer is annealed after its formation. The annealing is performed to substantially remove the solvent from the dielectric layer.

Figure 1F:
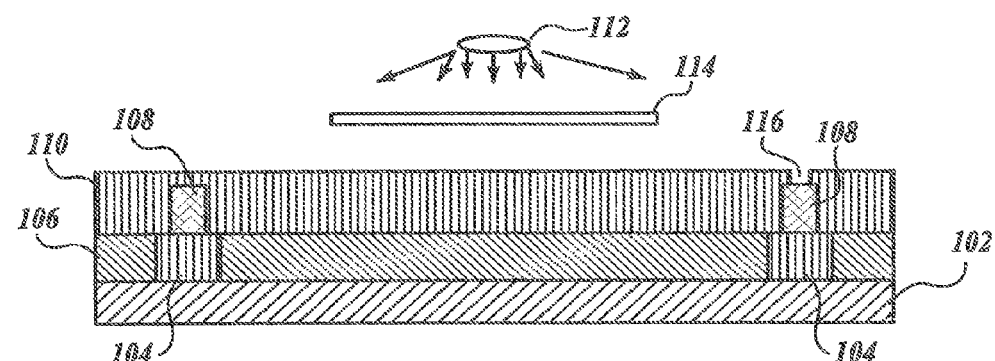
Figure 1G:
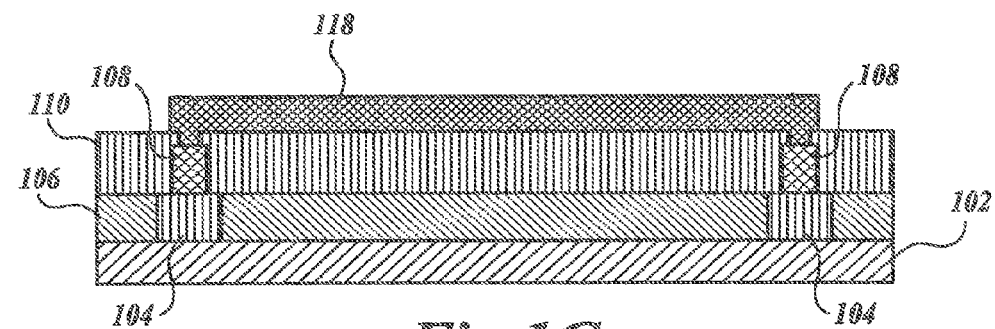

Referring to FIG. 1F, illustrating a flash annealing process with a flash anneal apparatus 112 that emits energy having a wavelengths ranging from about 250 nm to about 1100 nm or higher. A single filter, multiple filters, or other suitable device 114 is utilized to prevent energy having wavelengths from about 250 nm to about 350 nm from irradiating the substrate including nanoparticle ink.

The filter(s) or device 114 prevents damage to the organic semiconductor material 106 and/or dielectric material 110 thereby increasing the performance of the transistor by allowing higher on and lower off channel currents translating into greater linear and/or saturation motilities as shown herein.

This curing step also simultaneously creates vias 116 in the dielectric layer 110. The vias 116 are simultaneously formed as described in U.S. patent Ser. No. 11/764,326, which is hereby incorporated by reference. By forming vias in this manner, masking and etching processing steps eliminated, thereby improving the overall efficiency of processing.

A conductor layer is formed and patterned on the substrate, thereby forming a gate electrode 118 to be electrically coupled to the conductive posts 108 through vias 116. In this embodiment, the gate electrode 118 is formed from gold or silver with evaporated deposition techniques and etched to the desired shape with conventional photolithography.

FIGS. 2A-2G illustrate sequential process steps for forming a bottom gate organic transistor according to another embodiment of the invention.

Referring now to FIGS. 2A-2G, a method of forming an organic semiconductor transistor includes providing a substrate 202 and forming a patterned gate electrode 204 on the substrate 202. The gate electrode 204 is formed via techniques as described herein.

Conductive posts 206 are formed on the gate electrode 204. The conductive posts 206 are printed using nanoparticle conductive ink. This printing permits selective formation of the conductive posts 206. That is, the conductive posts 206 are selectively formed on the gate electrode 204. In this embodiment, the Ag nanoparticle ink was used to form the conductive posts 206 as described herein.

A dielectric layer 208 is formed over the substrate, thereby covering the conductive posts 206. It is noted, that the dielectric layer 208 may be formed to a height lower than the conductive posts 206. In this embodiment, the dielectric layer 208 is a long chain hydrophobic polymer and is printed onto the substrate. The dielectric layer is annealed after its formation.

Figure 2A:
Figure 2B:
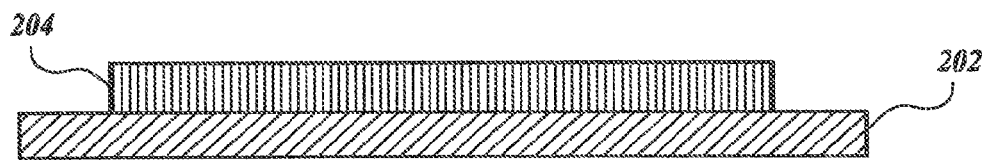
Figure 2C:
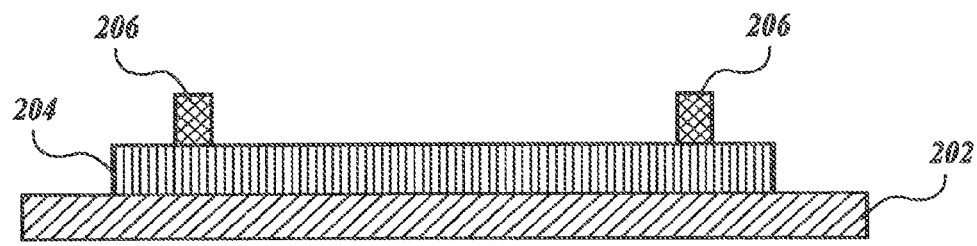
Figure 2D:
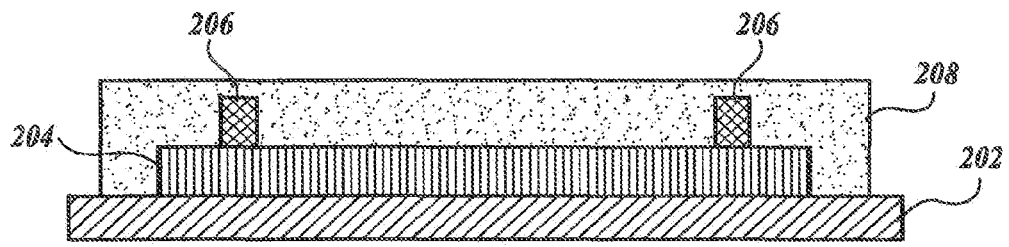
Figure 2E:
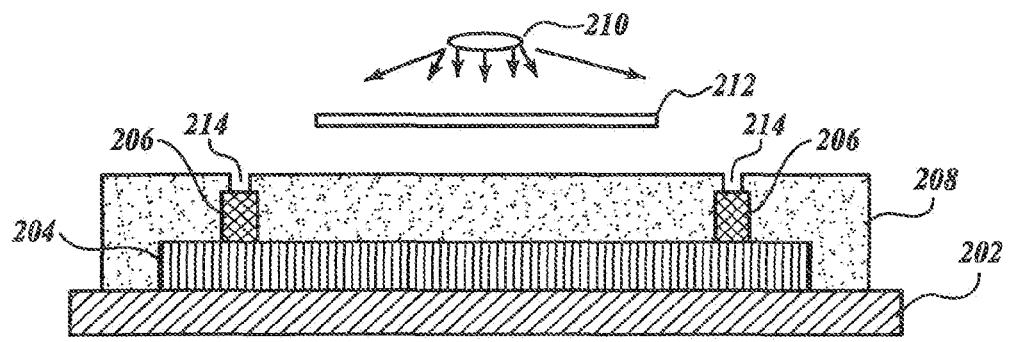
Figure 2F:
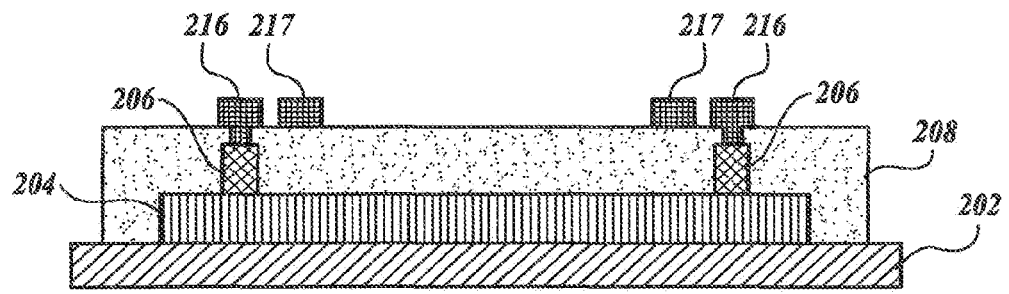

Referring to FIG. 2E, illustrating a flash annealing process with a flash anneal apparatus 210 that emits energy having wavelengths ranging from about 250 nm to about 1100 nm or higher. A single filter, multiple filters, or other suitable device 212 is utilized to prevent energy having wavelengths from about 250 nm to about 350 nm from irradiating the substrate including nanoparticle ink.

This curing step also simultaneously creates vias 214 in the dielectric layer 208. The vias 214 are simultaneously formed as described in U.S. patent Ser. No. 11/764,326, which is hereby incorporated by reference. By forming vias 214 in this manner, masking and etching processing steps are eliminated, thereby improving the overall efficiency of processing.

A conductor layer is formed and patterned on the substrate, thereby forming interconnects 216 (electrically coupled to the conductive posts 206 through vias 214) and source/drain regions 217. In this embodiment, the source/drain regions 217 are formed from gold or silver with evaporated deposition techniques and etched to the desired shape with conventional photolithography.

Conductive source/drain regions 217 are formed from Au with photolithography and deposition techniques described herein. The conductive posts 206 are electrically coupled to the gate electrode 204.

Figure 2G:
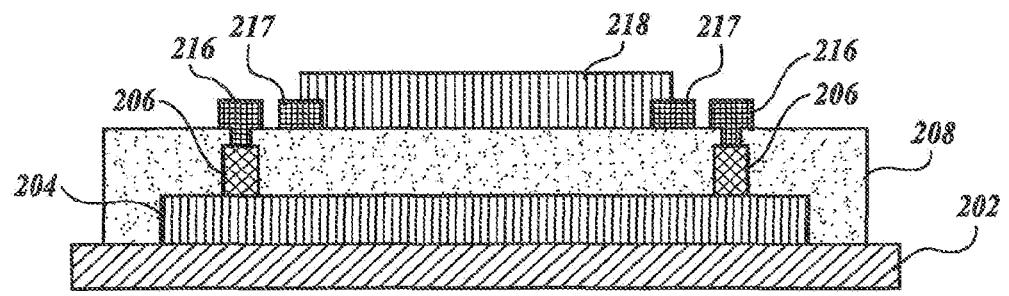

An organic semiconductor layer 218 is formed on at least a portion of the dielectric layer 208 and spanning between the source/drain regions 217, as illustrated in FIG. 2G. In this embodiment, the organic semiconductor layer 218 is a polymer, e.g., a polythiophene derivative and selectively formed, e.g., printed using an inkjet printer. The semiconductor layer is annealed with a heating apparatus.

Any number of electric devices may be formed from the techniques disclosed herein. For example, organic displays, organic RFID devices and the like may be formed. Moreover, other organic transistor structures may also be formed such as staggered gate transistors.

EXAMPLES

The following is a list of examples that were prepared with regard to the invention.

Example 1

In example 1a plurality of transistors were fabricated across a substrate having various sized source/drain regions. The various sized source/drain regions are characterized as having different lengths and widths as shown in Table 1 below. The width is defined as the distance of the source/drain in the z-axis direction into the electrode paper. The length is defined as the channel length, i.e., the distance between the source and the drain electrode. The fabrication included the following process:

Step 1: (Providing a substrate) A PET plastic substrate received from DuPont was provided.

Step 2: (Forming a source/drain regions) A layer of Au was deposited across the substrate with E-beam deposition equipment from CHA Industries model no. SEC RAP. Photolithography was performed on the Au layer and it was chemically wet etched with potassium iodide (KI) for about 1 to about 2 seconds to form a plurality of different sized conductive source/drain regions. The different sized source/drain regions are shown in Table 1.

Step 3: (Forming an organic semiconductor material and annealing) An organic semiconductor material was printed on the substrate with DMP 2800 printing equipment from Dimatic-Fuji utilizing a polythiophene derivative polymer in a 1,2-dichlorobenzene solvent to a thickness of about 50 nm as known to one skilled in the art. The organic semiconductor material was annealed to a temperature of about 130° C. for about 5 minutes with a Terra Universal anneal apparatus model no. HP 11515B. The organic semiconductor was cooled for about 30 minutes at ambient temperature to a temperature of about 90° C.

Step 4: (Forming posts) Nanoparticle ink was selectively formed on the source/drain region, thereby forming conductive posts. More specifically, Ag nanoparticle ink was printed with equipment from Dimatic-Fuji model no. DMP 2831 using nanosilver ink that was dispersed in a solvent solution of ethanol ethylene glycol. The nanoparticle ink was formed to a thickness of about 500 nm.

Step 5: (Forming a dielectric material and annealing) A dielectric material was printed on the organic semiconductor material with equipment from Dimatic-Fuji model no. DMP 2831 utilizing a long chain hydrophobic polymer with a decahydronaphthalene solvent to a thickness of about 300 nm. The dielectric material was annealed to a temperature of about 100° C. for about 20 minutes with a Terra Universal anneal apparatus model no. HP 11515B. Next, the dielectric material was cooled to room temperature.

Step 6: (Flash annealing the device) The substrate was subjected to flash annealing with a PCS™ 1100 Photonic Curing System™ by NovaCentrix. The flash annealing produced cured the Ag nanoparticle ink of the conductive posts, while simultaneously it produced vias to through a portion of the dielectric to the conductive posts. The flash annealing was conducted at about 950 Volts to about 1000 Volts with a pulse time of about 300 microseconds for one pulse, i.e., 300 microseconds.

The flash annealing apparatus produced energy having wavelengths ranging from about 250 nm to about 100 nm. A soda-lime glass filter, i.e., single frosted filter from Corning Glass Works, Model No. 2948, was placed about 2 mm from the sample and 2 cm from the lamp of the flash annealing unit. More specifically, three of those filters were placed on top of one another each filter had a thickness of about 0.96 mm to about 1.06 mm. The filters prevented energy having wavelengths from about 250 nm to about 350 nm from irradiating the substrate.

Step 7: (Forming gate conductor) A gate conductor was deposited with a shadow mask using a CHA Industries model no. SEC RAP e-beam evaporator. More specifically, an Au gate conductor was deposited to about 1000 Angstroms and patterned to form a gate conductor.

Comparative Example 2

In this example a plurality of top-gate organic transistor were formed across a substrate. The transistors were formed following steps 1-7. However, step 6 was modified to not include a soda-lime glass filter. Rather, in step 6 no filter was utilized during the flash annealing process.

Summary Results:

Tables 1 and 2 provide a summary of the results of examples 1 and 2. Specifically, with regard to both tables the locations 1-5 are areas across the substrate having transistors with different widths and lengths. Length as used in tables 1 and 2 is the distance between the source and drain regions of a specific device. That is, the length is the channel length between the source and drain regions. Width as used in tables 1 and 2 is the distance into the paper of the source of drain regions of a specific device. For example, at location 1 in Table 1 the organic transistor had a width of 120 μm and a length of 2 μm. The length and width designations are the same for Table 2.

At each of the five locations in Tables 1 and 2 the linear mobility and saturation mobility were calculated. Linear mobility is defined as the response of charge carriers in a semiconductor under an applied electric field in the linear regime of operation of the transistor. More specifically, linear mobility is calculated as shown in equation 1. Saturation mobility is defined as the response of charge carriers in a semiconductor under an applied electric field in the saturation regime of operation of the transistor. More specifically, saturation mobility is calculated with Equation 2 below.

$$\mu_{linear} = \frac{LC}{WV_D}\left|\frac{\partial I_D}{\partial V_G}\right|_{V_D=const} \quad \text{Equation 1}$$

The variables and units of Equation 1 are as follows: $\mu_{linear}$=Linear Mobility [Cm$^2$/Vs], L=Channel Length [μm], W=Channel Width [μm], $V_D$=Drain Voltage [V], $V_G$=Gate Voltage [V]

C=Capacitance [F], and The $\partial I_D/\partial V_G$ is the slope quantifiable from a transistor diagram trace.

$$\mu_{saturation} = \frac{2LC}{W}\left[\left|\frac{\partial \sqrt{I_D}}{\partial V_G}\right|_{V_D=const}\right]^2 \quad \text{Equation 2}$$

The variables and units of Equation 2 are as follows: unit $\mu_{Saturation}$=Saturation Mobility [Cm$^2$/Vs], L Channel Length [μm], W=Channel Width [μm], $V_D$=Drain Voltage [V], $V_G$=Gate Voltage [V], C=Capacitance, and $\partial\sqrt{I_D}/\partial V_G$ is the slope quantifiable from a transistor trace.

The linear mobility and saturation mobility were calculated and are displayed in Tables 1 and 2 as follows:

TABLE 1

Results of Example 1 Using a Soda Lime Glass Filter Used

| Location on Substrate | Source/Drain (Width [μm]/ Length [μm]) | Linear Mobility [Cm$^2$/Vs] | Saturation Mobility [Cm$^2$/Vs] |
|---|---|---|---|
| Location 1 | 120/2 | 4.77E−02 | 1.48E−01 |
| Location 2 | 120/3 | 3.59E−02 | 6.58E−02 |
| Location 3 | 120/4 | 2.53E−02 | 4.57E−02 |
| Location 4 | 120/8 | 4.18E−02 | 5.23E−02 |
| Location 5 | 240/3 | 3.65E−03 | 1.28E−02 |

TABLE 2

Results of Comparative Example 2 Using No filter

| Location on Substrate | Source/Drain (Width [μm]/ Length [μm]) | Linear Mobility [Cm$^2$/Vs] | Saturation Mobility [Cm$^2$/Vs] |
|---|---|---|---|
| Location 1 | 120/2 | 7.56E−04 | 2.49E−03 |
| Location 2 | 120/3 | 1.51E−03 | 3.59E−03 |
| Location 3 | 120/4 | 3.46E−04 | 2.80E−03 |
| Location 4 | 120/8 | 6.54E−03 | 1.28E−02 |
| Location 5 | 240/3 | 3.88E−04 | 1.12E−03 |

The mobility preservation as compared to an unprotected substrate is made evident by comparing the linear and saturation mobilities shown in Tables 1 and 2 at various locations. More specifically, by comparing location 1 in Tables 1 and 2 a two order of magnitude improvement between the linear and saturation mobilities has been demonstrated. In general, the higher the linear and saturation mobilities the better the performance of the overall device. That is, the higher linear and saturation mobilities translate to a higher on current and a lower off current for the transistor, thereby providing a significant improvement over the comparative device.

It will be apparent to those skilled in the art that various modifications and variations can be made in the invention without departing from the spirit or scope of the invention. Thus, it is intended that the present invention cover the modifications and variations of this invention provided they come within the scope of the appended claims and their equivalents.

What is claimed is:

1. A method of manufacturing an organic transistor, comprising:
    providing a substrate;
    forming a gate electrode on the substrate;
    selectively forming nanoparticle ink on the gate electrode to form posts;
    selectively forming a dielectric material on the substrate;
    flash annealing the nanoparticle ink with an energy having wavelengths ranging from about 250 nm to about 1100 nm or higher, wherein the flash annealing comprises preventing energy having wavelengths from about 250 nm to about 350 nm from irradiating the nanoparticle ink, and
    wherein the flash annealing cures the nanoparticle ink and simultaneously forms vias in the dielectric layer above the posts;
    forming source/drain electrodes in electrical communication with the posts; and
    forming an organic semiconductor layer on the substrate.

2. The method of claim 1, wherein the preventing the energy having wavelengths from about 250 nm to about 350 nm from irradiating the substrate step comprises providing at least one filter to substantially prevent the wavelengths from about 250 nm to about 350 nm from irradiating the nanoparticle ink.

3. The method of claim 2, wherein the at least one filter comprises three soda lime glass filters.

4. The method of claim 1, wherein the organic semiconductor material comprises a polythiophene derivative polymer.

5. The method of claim 1, wherein the source/drain electrodes are formed from a material selected from the group consisting of gold, silver, platinum, and combinations thereof.

6. The method of claim 1, wherein the gate electrode is formed with electron beam deposition.

7. The method of claim 1, wherein the selectively forming nanoparticle ink step comprises selectively printing Ag nanoparticle ink.

8. The method of claim 1, wherein the organic transistor is used in at least one of a display device and RFID device.

* * * * *